United States Patent
Bergstedt et al.

(10) Patent No.: US 6,724,283 B2
(45) Date of Patent: Apr. 20, 2004

(54) ARRANGEMENT MOUNTED ON A PRINTED CIRCUIT BOARD AND METHOD OF PRODUCING SUCH AN ARRANGEMENT

(75) Inventors: Leif Bergstedt, Sjömarken (SE); Spartak Gevorgian, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/984,438

(22) Filed: Oct. 30, 2001

(65) Prior Publication Data

US 2002/0055199 A1 May 9, 2002

(30) Foreign Application Priority Data

Oct. 31, 2000 (SE) ................................. 0003978

(51) Int. Cl.$^7$ .................................................. H01P 3/08
(52) U.S. Cl. ...................... 333/246; 333/239; 333/248
(58) Field of Search .................... 333/246, 239, 333/248, 238; 29/825, 828, 800

(56) References Cited

U.S. PATENT DOCUMENTS

| | | | |
|---|---|---|---|
| 3,613,230 A | * 10/1971 | Griff | ............................ 29/828 |
| 4,647,882 A | * 3/1987 | Landis | ........................ 333/239 |
| 4,673,904 A | 6/1987 | Landis | |
| 4,720,693 A | * 1/1988 | Tikes | .......................... 333/252 |
| 4,776,087 A | 10/1988 | Cronin et al. | |
| 4,909,909 A | 3/1990 | Florjancic et al. | |
| 5,363,550 A | 11/1994 | Aitken et al. | |
| 5,381,596 A | * 1/1995 | Ferro | ........................... 29/600 |
| 5,652,557 A | 7/1997 | Ishikawa | |
| 5,786,739 A | * 7/1998 | Paul et al. | .................... 333/210 |

FOREIGN PATENT DOCUMENTS

WO   WO98/06243 A1   2/1998

* cited by examiner

*Primary Examiner*—Robert Pascal
*Assistant Examiner*—Kimberly E Glenn

(57) ABSTRACT

The invention relates to a microwaveguide that is integrated in the dielectric layer of a conductor carrier, e.g. a printed circuit board. The waveguide enables different types of active and/or passive functions intended to influence the signals sent through the waveguide to be integrated at appropriate positions in the waveguide.

14 Claims, 8 Drawing Sheets

US 6,724,283 B2

ARRANGEMENT MOUNTED ON A PRINTED CIRCUIT BOARD AND METHOD OF PRODUCING SUCH AN ARRANGEMENT

FIELD OF INVENTION

The present invention relates to an arrangement mounted on a conductor carrier, for instance a printed circuit board, and methods of producing a conductor carrier that includes said arrangement.

DESCRIPTION OF THE BACKGROUND ART

So-called printed circuit boards or component carriers that can be used beneficially for implementing different circuitries are at present used in practically all modern electronic equipment. These printed circuit boards afford many advantages. Among other things, they are simple to manufacture, they can be disposed in lucid and space-saving fashion in the equipment, and can be readily replaced or exchanged. A printed circuit board comprises a carrying basic part on which a layer of non-conductive dielectric material is applied. The components with which the function of the board is achieved are interconnected by thin conductors that extend in or on the dielectric layer.

Present-day trends, for instance within mobile telephony, are directed towards the development of ever smaller system solutions and also towards higher transmission frequencies, which also place an increasingly higher demand on the design and dimensioning of printed circuit boards. In present-day technology, the signal conductors are produced with traditional microstrip techniques or some other stripline technique. However, it is more usual to use microwaveguides for the transmission of signals above 20 GHz.

One desideratum in this connection is to be able to arrange microwaveguides and devices for influencing the signals transferred by the microwaveguide on a printed circuit board in a beneficial fashion.

SUMMARY OF THE INVENTION

The present invention addresses the problem of creating a printed circuit board that includes signal conductors which can be used for the transmission of high frequency signals.

One object of the invention is to create a solid microwaveguide on a printed circuit board.

This object is achieved in accordance with the invention, by means of a microwaveguide which is either integrated entirely in the dielectric layer of said board or to at least a major part. The microwaveguide is therewith characterised in accordance with claim 1 or claim 2.

Another object of the present invention is to create a microwaveguide with the possibility of integrating different kinds of active and/or passive functions at appropriate places along the waveguide, said functions being intended to influence the signals sent in the waveguide.

This object is achieved with the arrangement according to claim 3 or claim 4.

Advantageous modifications of the invention will be apparent from the dependent claims 5–10.

A further object of the invention is to provide commercially useful methods of producing the arrangement according to claims 1–10.

This object is achieved with the methods defined in claims 11–14.

A first advantage afforded by the inventive arrangement resides in the possibility of creating a solid waveguide which can be integrated in the dielectric layer of the printed circuit board in a space-saving fashion.

Another advantage afforded by the inventive arrangement resides in the possibility of integrating signal influencing functions into the microwave guide.

A further advantage afforded by the invention resides in the ability of satisfying the requirement of low crosstalk on a printed circuit board that includes densely packed electronic devices.

Another advantage afforded by the inventive arrangement resides in the possibility of creating sequentially layered printed circuit boards.

An advantage afforded by the inventive methods resides in the simplicity in which the steps of producing the inventive arrangement can be integrated in existing manufacturing processes, and in enabling these steps to be carried out with one and the same tool.

BRIEF DESCRIPTION OF THE DRAWINGS

The invention will now be described in more detail with reference to preferred exemplifying embodiments thereof and also with reference to the accompanying drawings.

DESCRIPTION OF PREFERRED EMBODIMENTS

Figure 1A:
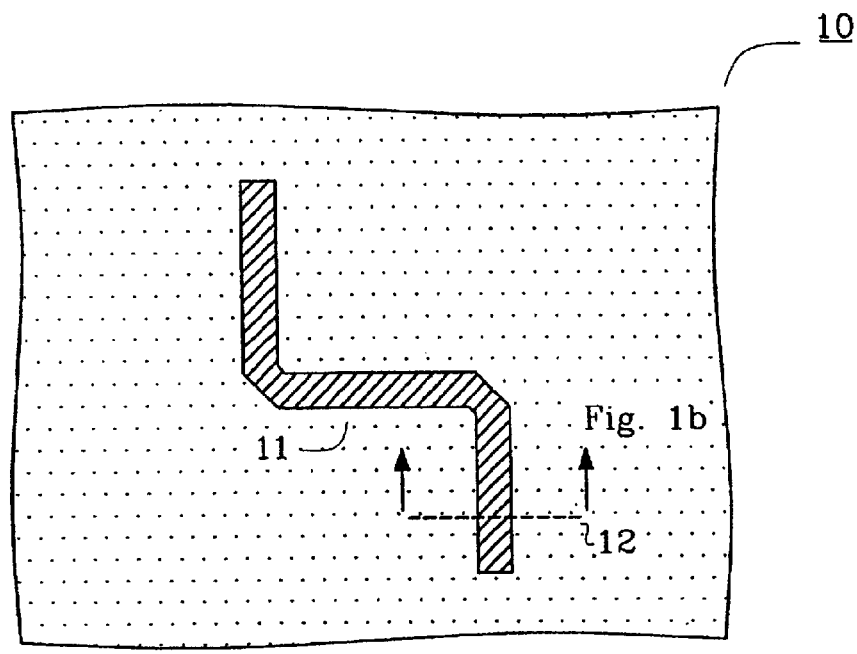
FIGS. 1a and 1b illustrate a printed circuit board that includes the inventive microwaveguide, seen in a view from above and in cross-section respectively.
Figure 1B:
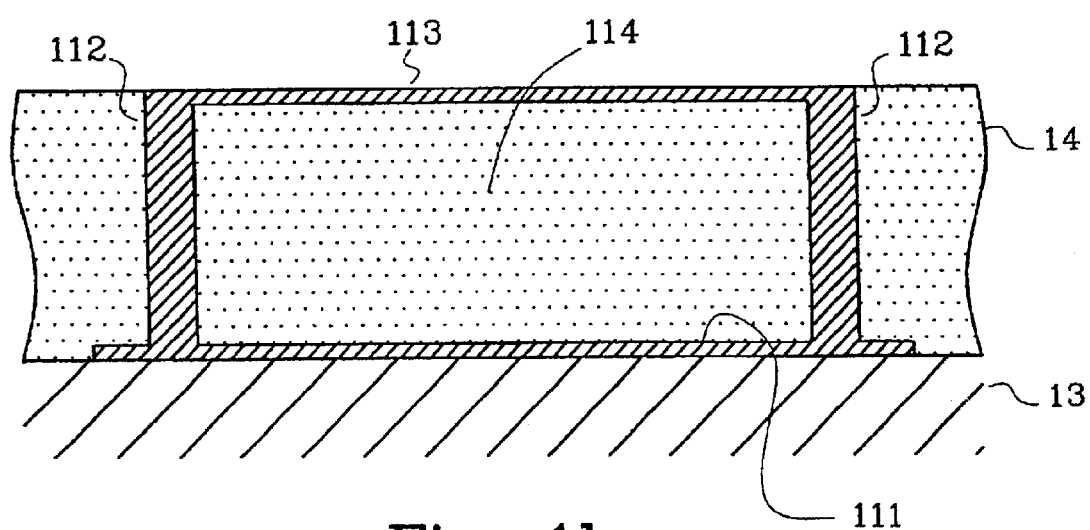

The present invention relates to a solid microwaveguide for the transmission of high-frequency signals that can be integrated in the dielectric layer of a printed circuit board plane. FIG. 1a shows a part of a printed circuit board 10 that includes an integrated microwaveguide 11 according to the invention in plan view, and FIG. 1b is a cross-sectional view of the board 10 and the microwaveguide 11 taken on the line 12. The scale in FIG. 1b is much larger than in FIG. 1a, and only a small part of the dielectric layer that surrounds the waveguide 11 is shown in FIG. 1b. The printed circuit board is constructed in all essentials on a base laminate 13 as a carrying basic layer and a thin layer of an appropriate dielectric material 14 disposed on said base laminate, wherein the structure of the microwaveguide 11 according to the invention can be bedded into said material 14, among other things.

The entire microwaveguide 11, or at least a major part of said waveguide, is integrated in the dielectric layer 14 and consists of a conductive earth plane 111, which is placed on the base laminate 13, and a ceiling 113 as the upper termination of the waveguide. The earth plane 111 and the ceiling 113 are interconnected by two vertical side walls 112, which are integrated in the dielectric layer at a given distance apart, so as to form a closed cavity 114. In the case of the illustrated example, the cavity 114 is filled with the same dielectric material as that used for the dielectric layer 14 on the printed circuit board. The upper side of the earth plane 111 and the underside of the ceiling 113 face inwardly towards the microwaveguide and are preferably produced with a highly polished surface. The design of the side walls of the waveguide, on the other hand, is less important. Alternatively, in accordance with a conceivable modification the cavity 114 may be filled with a dielectric material that is different to the dielectric material used for the dielectric layer 14 of the printed circuit board.

A suitable dielectric material can be chosen in accordance with a number of criteria: A first criterion is that an appropriate material will have low losses, which can be satisfied by material that has high average dielectric constant $\epsilon r$ at least in the regions nearest the metal surfaces of the waveguide. Another choice criterion may lie in material costs. Another choice criterion takes into account the processes for producing the microwaveguide. In the preferred method of manufacture, the microwaveguide is produced by processing the dielectric layer of the circuit board with a laser beam, which makes it necessary to be able to process or work the material with a laser in a simple manner. Dielectrics of the PTFE-type are examples of such material. Another method of manufacture uses photodielectric materials. Instead of using an homogenous dielectric, a conceivable modification is to use in the waveguide cavity an inhomogeneous dielectric material that is constructed in a manner such that the high-quality dielectric material described above will be located solely in regions close to the metal surfaces of the waveguide, and particularly close to the earth plane 111 and the ceiling 113 of the waveguide, wherewith the demands on the dielectric material may be less high in other spaces that lack a strong electric field.

The cross-sectional area of the waveguide must be chosen in relation to the signal frequency. The cross-sectional area of the waveguide shall decrease to extents corresponding to higher signal frequencies. Typical fields of use of the microwave guide are, for instance, distribution networks in antenna-integrated electronics with signal frequencies higher than 20 GHz or commercial electronics about 40 GHz. Consequently, the waveguide cavity may be filled with another dielectric material with the intention of reducing the cross-sectional area, e.g. in response to demands concerning board height. The design of the printed circuit board in other respects has an influence on the dimensioning of the microwaveguide. For example, in the case of a printed circuit board in which electronic components are very densely packed, it is necessary to place high demands on low crosstalk. Both cases require the dielectric material to be able to bind the electric fields of the waveguide in said cavity in the absence of any significant leakage of field lines in the space outside the waveguide.

The waveguide 11 composed of the aforesaid components 111–113 comprises a suitable electrically conductive material which is chosen, for instance, on the basis of the performance requirements of the signal transmission on the circuit board. Although this material will normally be copper, gold may alternatively be used when very effective conductivity is required.

The invention may be used beneficially to create waveguides that have integrated active or passive functions. Filter or trimming devices are examples of passive functions. Examples of active functions of various types of amplifiers or diodes. These functions can be integrated in the waveguide in a space-saving manner. The accompanying FIGS. 2a and 2b, and 3a and 3b illustrate respectively microwave guides with two possible examples of integrated functions.

Figure 2A:
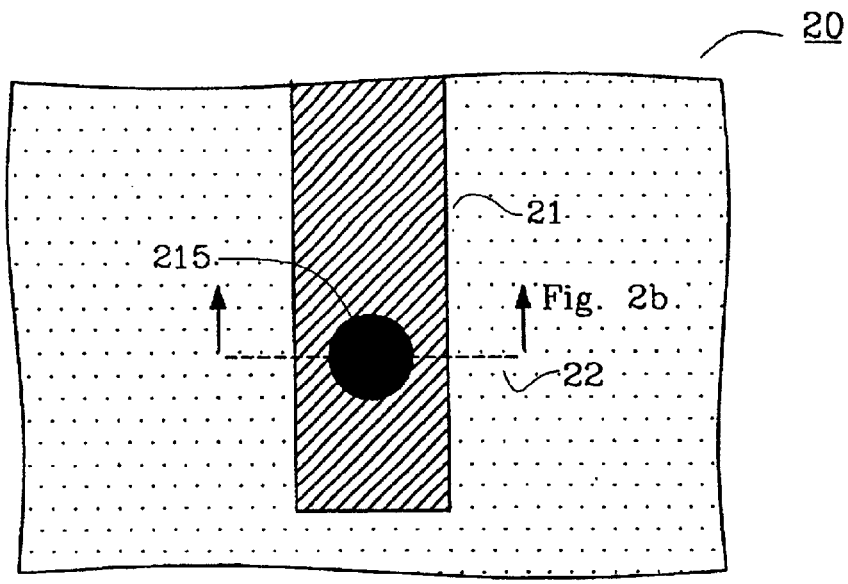
FIGS. 2a and 2b illustrate the microwaveguide according to the invention with an integrated filter function, seen from above and in cross-section respectively.
Figure 2B:
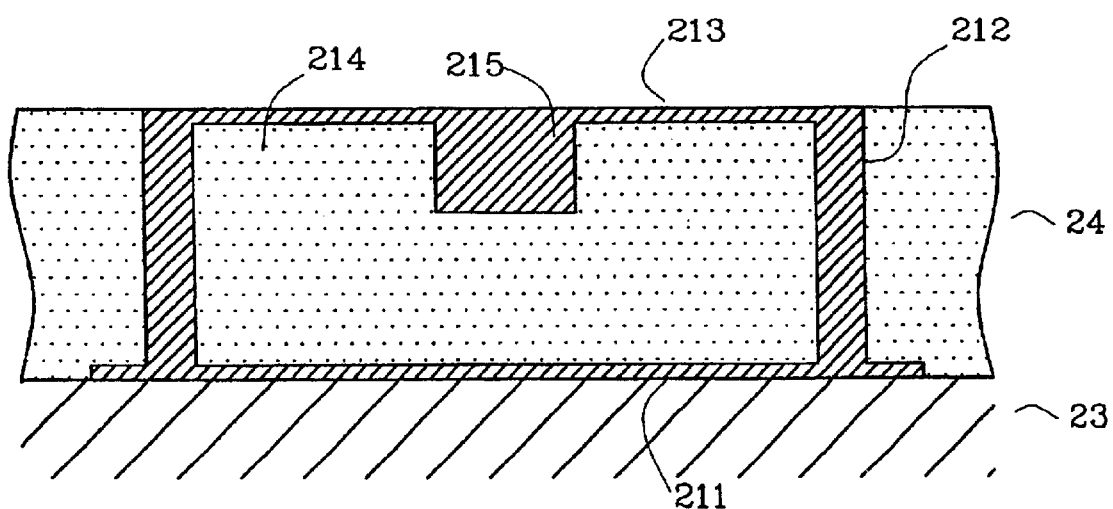

FIGS. 2a and 2b describe a microwaveguide 21 in which a filter function is integrated. FIG. 2a is a plan view of part of a printed circuit board 20 that has a microwaveguide 21 integrated in the dielectric layer 24 of said board, in accordance with the invention. FIG. 2b is a cross-sectional view of the printed circuit board 20 and the microwaveguide 21 taken on a section line 22. Propagation of the waves in the axial direction can be influenced by the provision of projections 215 comprised of the same material as the guide in general. These projections 215 are disposed on one inner wall of the waveguide and extend towards the opposite wall thereof, at appropriate locations in the direction of propagation. The projections 215 function as a filter that allows chosen waves to pass through. In the preferred embodiment illustrated in FIG. 2, there are used cylindrical projections which are disposed at the ceiling 213 of the waveguide, which is the simplest arrangement from the aspect of manufacture. However, the projections 215 may also be disposed at other locations, e.g. on the earth plane 211 of the waveguide. Another alternative is to provide projections both at the waveguide ceiling 213 and at the waveguide earth plane 211. The filter function is determined essentially by the diameter and length of the cylindrical projections.

Figure 3A:
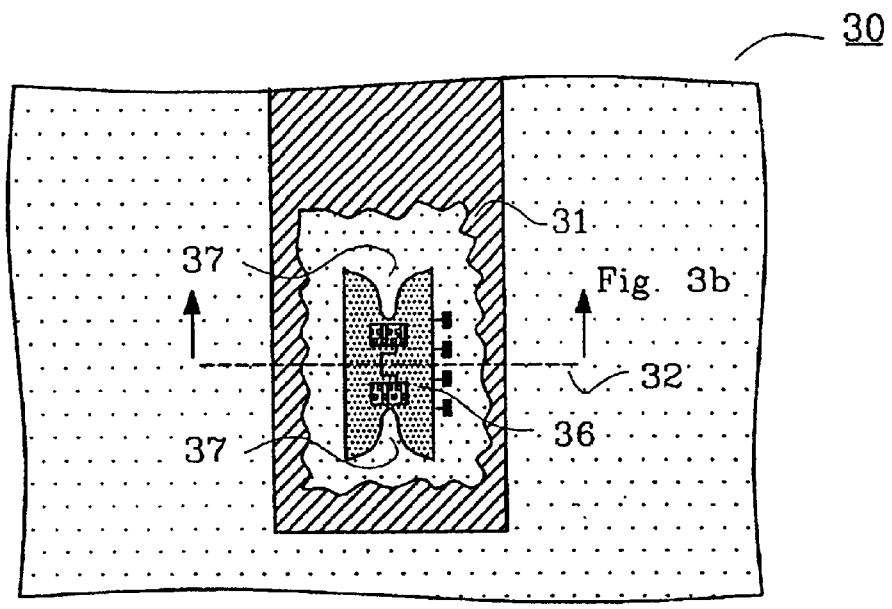
FIGS. 3a and 3b illustrate the microwaveguide according to the invention with an integrated active function, seen in a view from above and in cross-section respectively.
Figure 3B:
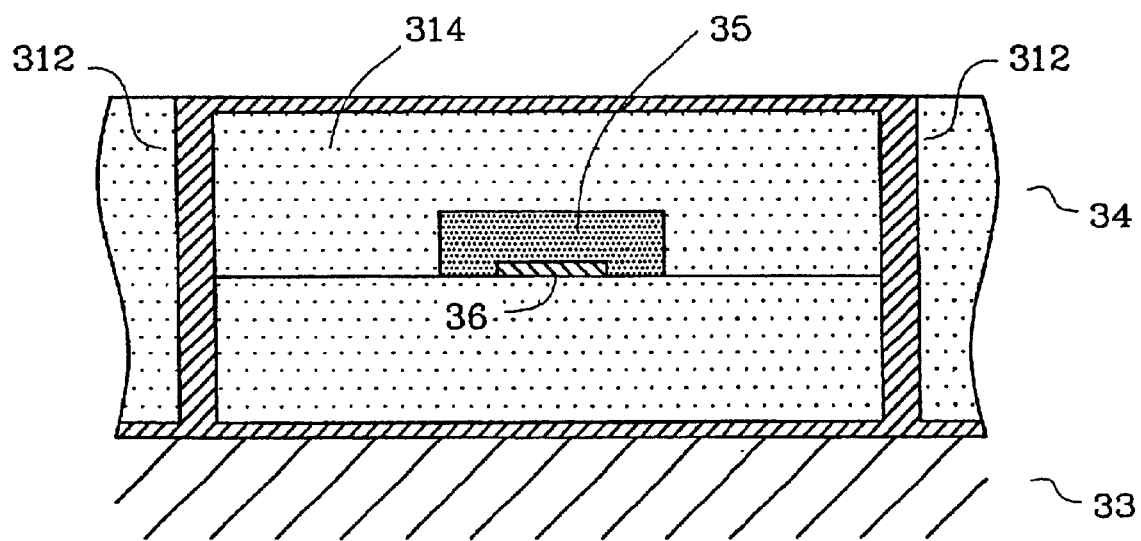

FIGS. 3a and 3b illustrate respectively an example of a microwaveguide that has integrated active functions which have an influence on the signals along the waveguide. Amplifying functions or diode functions are examples of possible functions in this regard. FIG. 3a is a plan view of part of a printed circuit board 30 that has a microwaveguide 31 integrated in the dielectric layer 34 of the board in accordance with the invention. In FIG. 3a, part of the waveguide ceiling 313 has been omitted in order to illustrate the integrated filter function. FIG. 3b is a cross-sectional view of the board 30 and the waveguide 31 taken on the line 32 in FIG. 3a. In the preferred embodiment, a layer of a different dielectric material is applied in the waveguide cavity 314 at a suitable distance from the waveguide delimiting surfaces, wherewith the layer forms in this material a cavity 35 at an appropriate position in the waveguide. This cavity 35 accommodates the requisite components and conductors 36 that constitute the function to be integrated in the waveguide. The waves are fed to the functionality embedded in the cavity 35, for instance with the aid of a funnel-like structure 37 formed at the short sides of the cavity by the dielectric material therein, in the direction of wave propagation in the waveguide. The remaining space in the waveguide surrounding the cavity 35 may either be empty or filled, for instance, with the dielectric material used for the dielectric layer 34 on the circuit board. Alternatively, a different dielectric material may be used. It is necessary to arrange the side walls 312 of the waveguide at a suitable distance from the functionality surrounded in the cavity 35, this distance being determined, for instance, by the electric field that spreads around the functionality. Alternatively, the functionality may be embedded in an inhomogeneous dielectric material in the waveguide cavity, said material having lower losses in the area around said functionality and closest to the metal surfaces of the waveguide than in remaining areas or regions.

Figure 4A:
FIGS. 4a–4d illustrate a method of producing the microwaveguide according to FIG. 1.
Figure 4B:
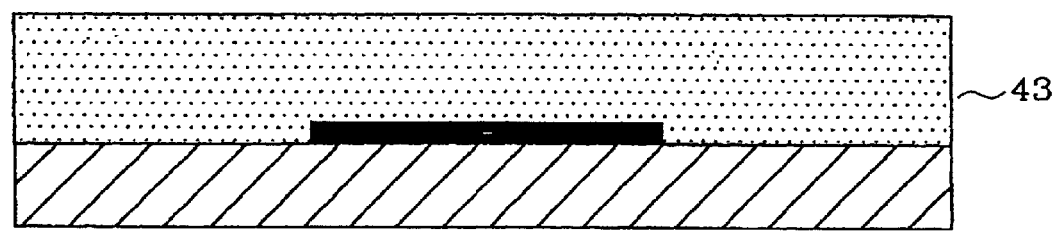
Figure 4C:
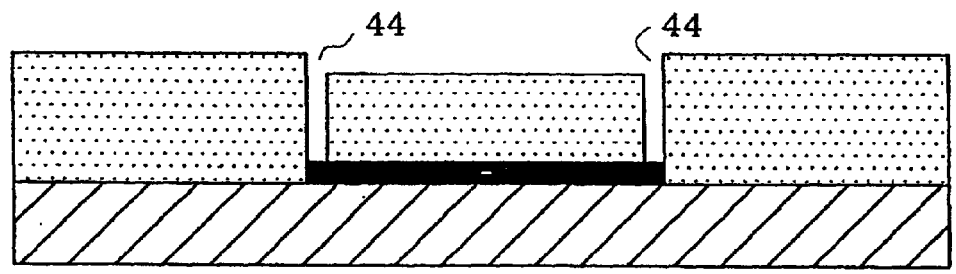
Figure 4D:
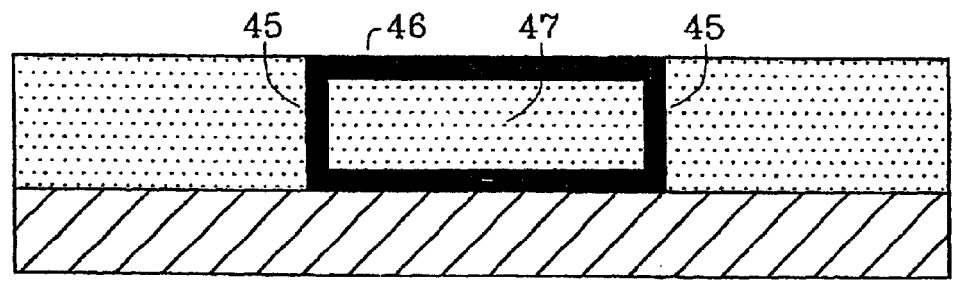

FIGS. 4a–4d show respectively the process steps necessary in producing the microwaveguide as described in FIG. 1. The manufacturing process is described in the following with reference to a preferred embodiment in which the slots and pits in the dielectric material of the printed circuit board are produced by laser processing the material, said slots and pits being intended for the surfaces of the waveguide. The inventive microwaveguide is produced, by placing an earth plane 41 on the base laminate 42 of the board, as shown in FIG. 4a. The earth plane layer 41 will preferably extend solely over that surface on which the microwaveguide shall be placed. The base laminate 42 and the earth plane 41 are then covered with a layer of an appropriate dielectric material 43, see FIG. 4b. In the next step, FIG. 4c, vertical slots 44 are cut into the dielectric material 43, to the level of the earth plane layer 41. The microwaveguide is produced by filling these slots 44 with the same material as that used for the earth plane 41, so as to form two side walls. A ceiling 46 comprised of a layer of the material used for the earth plane is then placed on top of the dielectric material 43 between the side walls 45, so as to form a closed cavity 47, see FIG. 4d.

Figure 5A:
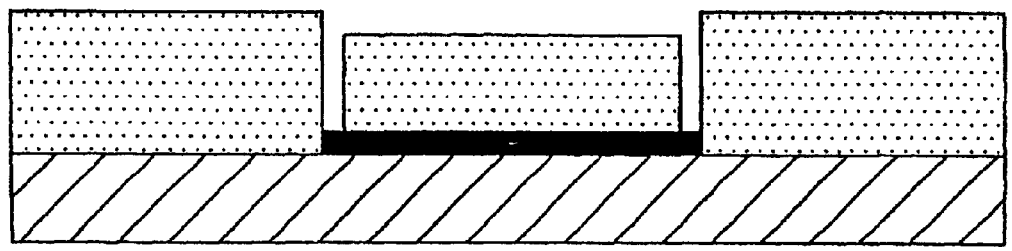
FIGS. 5a–5c illustrate further steps in the manufacture of the microwaveguide according to FIG. 2.
Figure 5B:
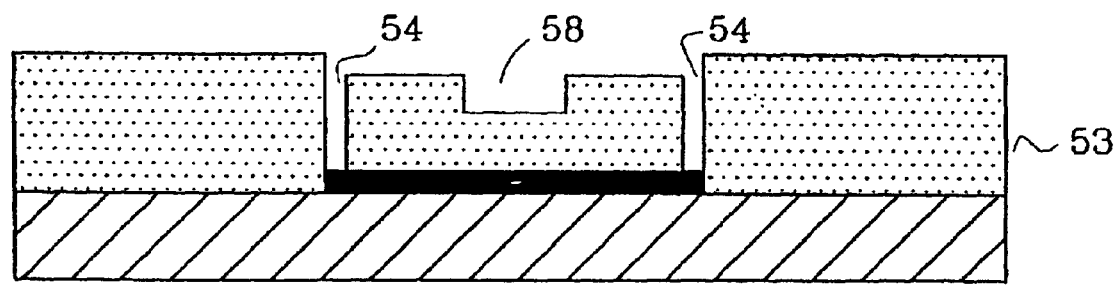
Figure 5C:
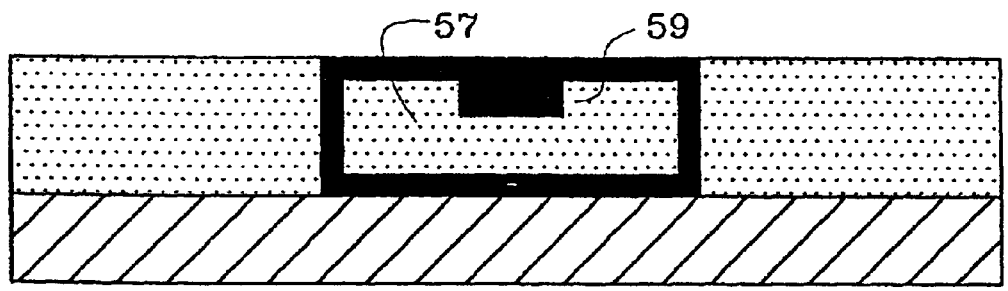

As described above with reference to FIGS. 2 and 3, it is possible to integrate various types of passive or active functions in the waveguide. FIGS. 5a–5c illustrate respectively the process steps required to integrate, for instance, a passive filter function in the microwaveguide. FIG. 5a takes as its starting point a printed circuit board that has been worked to a configuration according to FIG. 4c. The filter effect is achieved by inserting into the waveguide cavity a projection comprised of the same conductive material as that used for the waveguide. In the following process described hereinafter, the projection shall be disposed at the ceiling of the waveguide. A first step, FIG. 5a, comprises creating a pit or recess 58 in the dielectric material 53. The geometric measurements of the pit 58 are chosen in accordance with the desired shape and penetration depth of the intended filter projection 59. The pit 58 may conveniently be produced by the same type of tool as that used for cutting the slots 54 in producing the side walls of the waveguide. These slots 54 and the ceiling between said slots are filled/comprised with/of the same metallic material as that used in the manufacturing process of the waveguide, as described above with reference to FIG. 4d. As the ceiling of the waveguide is formed, the slots 58 are also filled with said metallic material, so as to obtain a filter projection 59 of desired measurements that extends into the waveguide cavity 57. The filter projections may be disposed at appropriate places in the longitudinal direction of the waveguide.

Figure 6A:
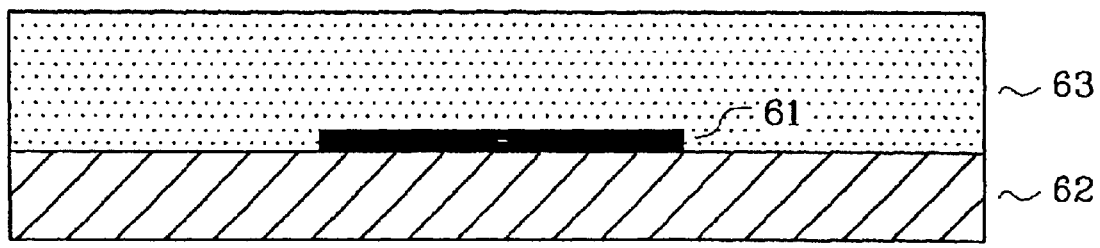
FIGS. 6a–6g illustrate a method of producing the microwaveguide according to FIG. 3.
Figure 6B:
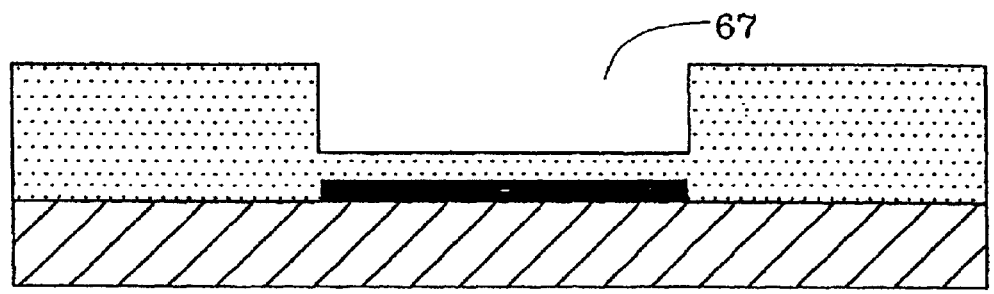
Figure 6C:
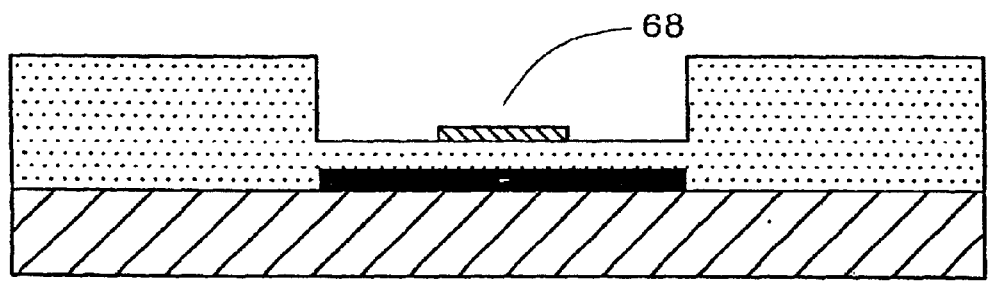
Figure 6D:
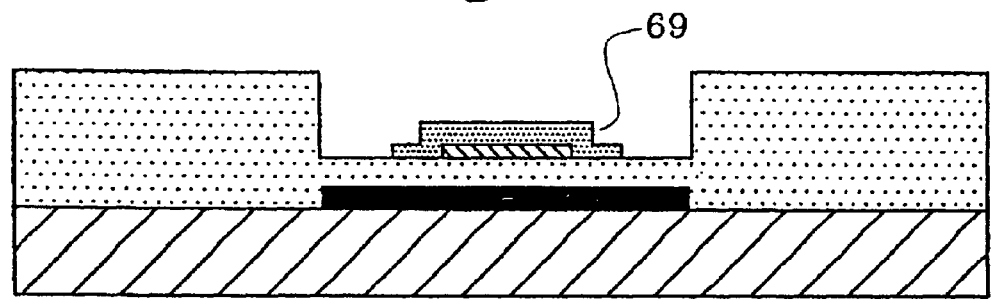
Figure 6E:
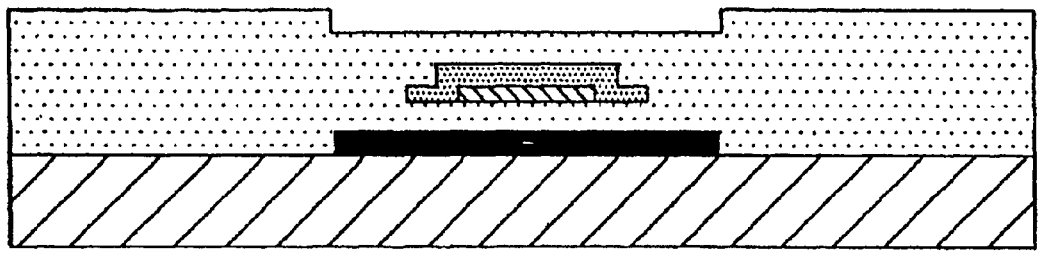
Figure 6F:
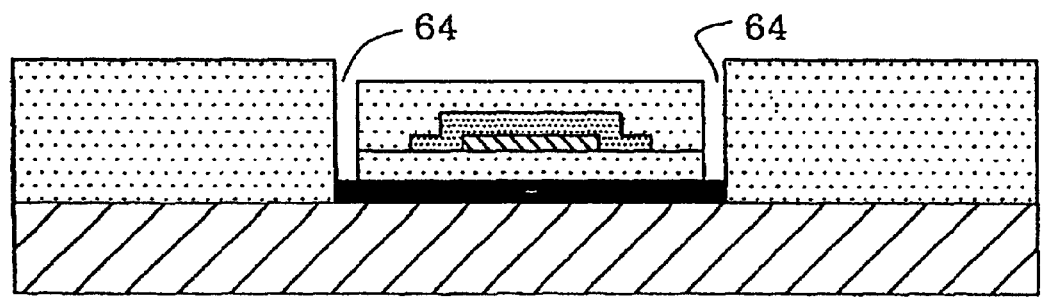
Figure 6G:
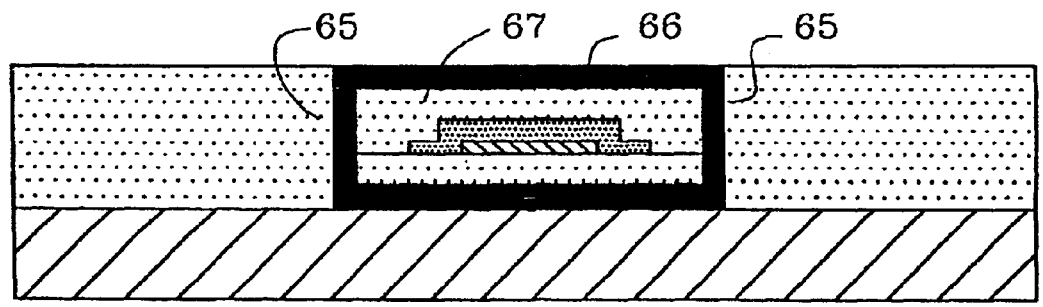

FIGS. 6a–6g respectively show the process steps necessary for integrating an active function in the waveguide. FIG. 6a takes as its starting point a printed circuit board that comprises a base laminate 62 and an earth plane 61 comprised of metallic material and disposed on said laminate. The laminate and the earth plane are covered with a layer of the dielectric material 63 used for the printed circuit board. A cavity that is intended to contain the active function is created by producing a pit 67 that has essentially the same width as the earth plane 61. The components and the conductors that form the active function are then disposed at an appropriate place in the pit 67, see FIG. 6c, whereafter the thus formed functionality 68 is covered with a layer 69 of dielectric material, see FIG. 6d. This dielectric material is preferably different to the material used in the layer 63 that covers the remainder of the board. The layer 69 is given the form of a funnel at the short sides in the direction of wave propagation, so as to allow the waves to move to and away from the functionality 68 embedded in the layer 69. In the next step, FIG. 6c, the pit 67 containing the embedded functionality 68 is then filled, for instance, with the dielectric material used on the remainder of the board. The layer 69 including the aforedescribed functionality 68 therewith forms a closed cavity within the dielectric layer 63. In the following steps, FIGS. 6f and 6g, two vertical slots 64 are cut through the dielectric material 63 up to the level of the earth plane 61, whereafter the microwaveguide is formed by filling the slots 64 with the same material as that used for the earth plane 61, and a closed cavity 67 that includes the desired functionality is formed by creating a ceiling 66 comprised of a layer of said material disposed between the waveguide side walls 65 on top of the dielectric material 63. These process steps are carried out in a manner similar to that described above with reference to FIGS. 4c and 4d.

Figure 7A:
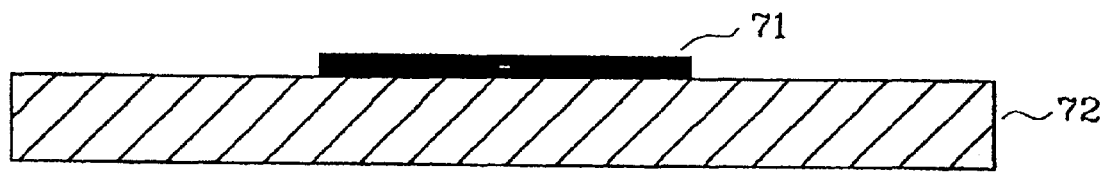
FIGS. 7a–7d illustrate an alternative method of producing the microwaveguide according to FIG. 1.
Figure 7B:
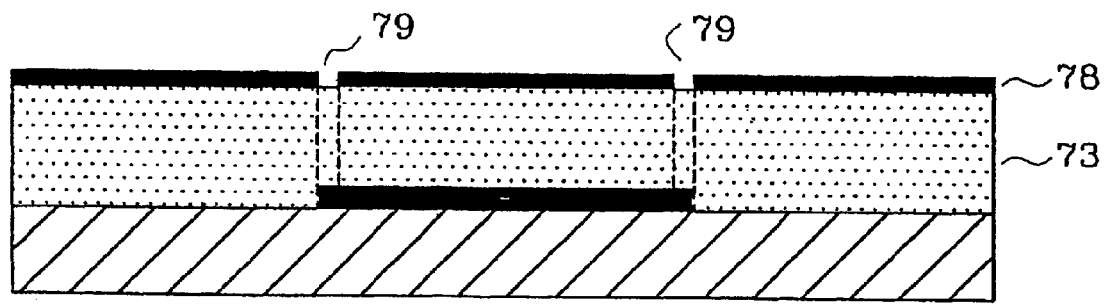
Figure 7C:
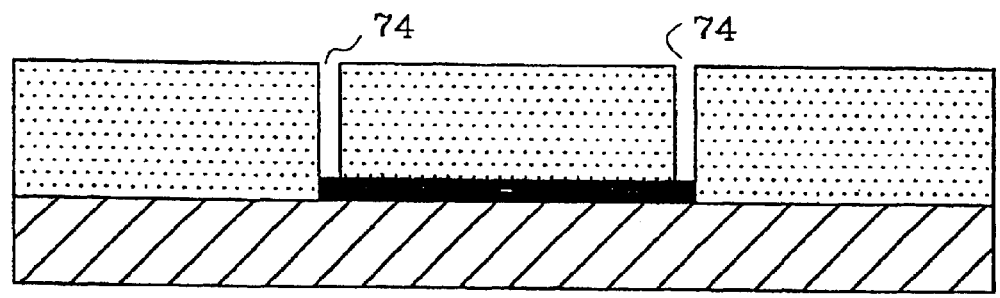
Figure 7D:
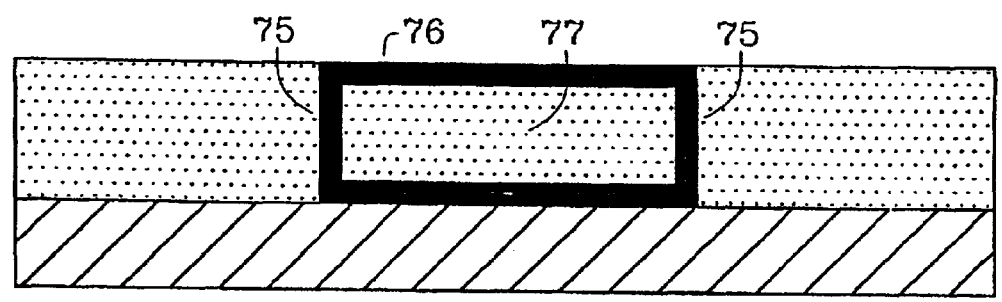

The processes for the manufacture of the microwaveguide according to the invention as described with reference to FIGS. 4–6 utilises a laser-based working of the dielectric material. An alternative manufacturing process utilises photosensitive dielectric material. This will now be described with reference to FIGS. 7a–7d. Shown in FIG. 7a is a base laminate 72 on which an earth plane 71 is arranged. FIG. 7b shows the laminate 72 and the earth plane 71 covered with a layer of a photosensitive dielectric material 73, which is then coated with a masking layer 78 in a manner such as to expose for development solely those surfaces where the vertical pits 74 shall be placed. Development is effected, for instance, by irradiating with light that is rich in energy. The slots 74 shown in FIG. 7c that are intended to form the side walls 75 of the waveguide are then filled with the material that shall be used for the production of the microwaveguide. There is finally placed a ceiling 76 of the same said material on top of the dielectric layer and between said side walls 75, so as to form a closed cavity 77, see FIG. 7d.

It will be understood that the invention is not limited to the aforedescribed and illustrated exemplifying embodiments thereof, and that modifications can be made within the scope of the accompanying claims.

What is claimed is:

1. A waveguide for the transmission of microwaves, comprising:
    electrically conductive surfaces that define a closed cavity for an arrangement on a printed circuit board that includes at least one carrying basic part and a layer of a first dielectric material disposed on said basic part, said waveguide not including a coaxial internal conductor along the length thereof,
    wherein:
        the waveguide is integrated in the dielectric layer of the printed circuit board and comprises at least one isolated region containing a component operative to influence the propagation of microwaves through said waveguide, end wherein the waveguide cavity is filled with a dielectric inhomogeneous material.

2. A waveguide according to claim 1, wherein said waveguide has a rectangular cross-sectional shape including an upper well and en opposing bottom wall, and wherein the upper wail and the dielectric layer lie on one and the same plane.

3. A waveguide according to claim 1, wherein said component operative to influence the propogation of microwaves through said waveguide comprises a filter-forming projection extending into said cavity.

4. A waveguide according to claim 1, wherein the cavity encloses at chosen positions along the waveguide an area which includes components and conductors that form a functionality which influences propagation of the waves along the wave guide.

5. A waveguide according to claim 4, wherein the functionality is embedded in a cavity consisting of a second dielectric material.

6. A waveguide according to claim 5, wherein the cavity has a funnel-shaped configuration at least one of the short sides in the direction of wave propagation.

7. A waveguide according to claim 1, wherein the waveguide cavity is filled with a third dielectric material.

8. A waveguide according to claim 1, wherein the conductive surfaces consist of copper.

9. A waveguide according to claim 1, wherein the sides of the earth plane and the ceiling facing inwardly towards the waveguide cavity have a highly polished surface.

10. A method of producing an integrated waveguide on a printed circuit board that includes at least one carrying basic part and an earth plane comprising electrically conductive material and disposed on said basic part and covering a layer of a first dielectric material, said waveguide not including a coaxial internal conductor along the length thereof, the method comprising the steps of:

producing the waveguide surfaces by:
cutting two slots at a given mutual distance apart through said dielectric material up to the earth plane;
filling the slots with sold electrically conductive material such as to form two side walls;
interconnecting the side walls with a layer of said electrically conductive material, such as to obtain a closed cavity; and
forming a component in at least one isolated region of said waveguide, said component operative to influence the propagation of microwaves through said waveguide, wherein said corn orient comprises a filter-forming projection which is produced in the waveguide cavity by creating a slot in the dielectric layer and filling the slot with said conductive material when the waveguide surfaces are produced.

11. A method according to claim 10, wherein the dielectric layer is removed in the region over the earth plane and filled with a second dielectric material, whereafter the waveguide surfaces are produced.

12. A method according to claim 10, wherein a functionality is provided in the waveguide cavity by removing the dielectric layer in the region over the earth plane to a given depth; arranging the functionality in the cavity, and covering with a dielectric material.

13. A method according to claim 12, wherein the functionality is embedded in a layer of a third dielectric material.

14. A method for producing an integrated waveguide on a printed circuit board that includes at least one carrying basic part and an earth plane comprised of electrically conductive material and disposed on the basic part, wherein said basic part and said earth plane are covered with a layer of a photosensitive dielectric material, said waveguide not including a coaxial internal conductor along the length thereof, the method comprising the steps of:

producing the waveguide surfaces by:
covering said dielectric layer with a masking layer that exposes two slots where the waveguide side walls shall be placed;
developing the non-masked regions so as to produce two slots;
filling the slots with the electrically conductive material so as to form two side walls;
interconnecting the side walls with a layer of said electrically conductive material so as to obtain a dosed cavity; and
forming a component in at least one isolated region of said waveguide, said component operative to influence the propagation of microwaves through said waveguide.

* * * * *

UNITED STATES PATENT AND TRADEMARK OFFICE
CERTIFICATE OF CORRECTION

PATENT NO. : 6,724,283 B2  Page 1 of 1
APPLICATION NO. : 09/984438
DATED : April 20, 2004
INVENTOR(S) : Bergstedt et al.

It is certified that error appears in the above-identified patent and that said Letters Patent is hereby corrected as shown below:

In Column 6, Line 49, in Claim 1, delete "end" and insert -- and --, therefor.

In Column 6, Line 53, in Claim 2, delete "well" and insert -- wall --, therefor.

In Column 6, Line 53, in Claim 2, delete "en" and insert -- an --, therefor.

In Column 6, Line 54, in Claim 2, delete "wail" and insert -- wall --, therefor.

In Column 7, Line 21, in Claim 10, delete "sold" and insert -- said --, therefor.

In Column 7, Line 29, in Claim 10, delete "corn orient" and insert -- component --, therefor.

In Column 8, Line 1, in Claim 11, after "with" insert -- a layer of --.

In Column 8, Line 6, in Claim 12, after "covering" insert -- the cavity --.

In Column 8, Line 29, in Claim 14, delete "dosed" and insert -- closed--, therefor.

Signed and Sealed this

Thirtieth Day of October, 2007

JON W. DUDAS
*Director of the United States Patent and Trademark Office*